United States Patent [19]
Kawanabe et al.

[11] 4,374,744
[45] Feb. 22, 1983

[54] STRIPPING SOLUTION FOR TIN OR TIN ALLOYS

[75] Inventors: Yutaka Kawanabe, Toyonaka; Takeyoshi Kishimoto, Yamatokoriyama, both of Japan

[73] Assignee: Mec Co., Ltd., Hyogo, Japan

[21] Appl. No.: 366,018

[22] Filed: Apr. 6, 1982

[30] Foreign Application Priority Data

Apr. 6, 1981 [JP] Japan ................... 56-50515

[51] Int. Cl.³ .................. C09K 13/06; C11D 7/00; C23F 1/00
[52] U.S. Cl. ......................... 252/79.4; 134/3; 156/664; 252/148

[58] Field of Search ............... 252/79.4, 148; 156/664; 134/3, 41

[56] References Cited

U.S. PATENT DOCUMENTS 4,251,384  2/1981  Rooney ........................... 252/148 X
4,297,257  10/1981  Elias et al. ..................... 252/79.4 X Primary Examiner—William A. Powell
Attorney, Agent, or Firm—Sughrue, Mion, Zinn, Macpeak & Seas

[57] ABSTRACT

A stripping solution for tin or tin alloys which comprises an inorganic and/or organic acid, an oxidizing agent and a heterocyclic compound free of a sulfur atom but containing a nitrogen atom in the form of =NH or ≡N as a ring-forming member.

12 Claims, No Drawings

STRIPPING SOLUTION FOR TIN OR TIN ALLOYS

FIELD OF THE INVENTION

The present invention relates to a stripping solution for tin or tin alloys, i.e., a solution used to strip or remove tin or tin alloys.

BACKGROUND OF THE INVENTION

In the fabrication of through-hole PCBs (printed circuit boards), there has heretofore been widely used the solder through-hole process in which solder is applied by electroplating. In this method, however, the danger of short-circuiting during soldering with more complex and dense circuit geometry on the PCB is increased. A solder resist, therefore, is often applied in order to avoid this problem. It is preferred that such a solder resist be applied to a copper plate rather than a solder plate since it adheres better on the copper plate than the solder plate. Thus it has been desired to develop a method in which after the through-hole is completed by the application of solder plating the solder is stripped or removed to form a copper through-hole.

Various techniques are known for stripping tin or tin alloys from metallic copper. Typical techniques are described in Japanese Patent Publication No. 17336/75 (Enthone, Inc. (U.S.A.)) and U.S. Pat. Nos. 3,990,982, 3,926,699, and 3,841,905 (RBP Chemical Corp. U.S.A.)).

The technique disclosed in the Enthone, Inc. patent is mainly directed to stripping solder plate at the terminals of a printed circuit board. Although this technique can be applied to the fabrication of a copper through-hole PCB, it has the disadvantage that the thiourea used as an additive in the stripping solution is absorbed onto a copper and deteriorates the adhesion of the solder resist applied at a subsequent step and solderability.

The stripping solutions disclosed in the RBP Corp. patents are mainly composed of acidic ammonium fluoride and hydrogen peroxide with suitable stabilizers. However, generally safety codes require that chemical compositions containing acidic ammonium fluoride, which is highly poisonous, must be specifically handled. A stripping solution containing acidic ammonium fluoride, therefore, is subject to various specific handling regulations and is not convenient to use. Furthermore, such stripping solutions have the disadvantage that they attack glass fibers in the substrate of a printed circuit board, causing measling.

SUMMARY OF THE INVENTION

The object of this invention is to provide a stripping solution for use in a method in which tin or a tin alloy plate is applied to form a through-hole in a printed circuit board and, thereafter, the tin or tin alloy is stripped from the board to complete a copper through-hole.

The present invention, therefore, relates to a stripping solution comprising an inorganic or organic acid, an oxidizing agent, and a heterocyclic compound not containing a sulfur atom but which contains a nitrogen atom in the form of $=NH$ or $\equiv N$.

DETAILED DESCRIPTION OF THE INVENTION

The use of the stripping solution of the present invention enables one to effectively strip a tin or tin alloy plate on a metallic copper surface with minimal attack on the underlying copper. Furthermore, the thus obtained copper through-hole board exhibit excellent resist adhesion and solderability.

Tin alloys removable by the present invention include tin-lead alloys containing at least 10 wt % of tin and the balance of lead and, preferably from 50 to 90 wt % of tin and the balance of lead. The tin-lead alloys may contain antimony or bismuth in an amount of less than 10 wt %.

In the stripping solution of the present invention, an inorganic and/or organic acid and an oxidizing agent conventionally used in the art are used. The presence of such inorganic and/or organic acids and oxidizing agents enables rapid dissolution of the tin or tin alloys.

Further, the use of one or more heterocyclic compounds free of a sulfur atom but containing a nitrogen atom in the form of $=NH$ or $\equiv N$ prevents the dissolution of copper, and redeposition of tin ions on the surface of copper in the state that such is adsorbed on the surface of copper and also prevents the oxidation of copper. The heterocyclic compounds do not inhibit adhesion of the solder resist and soldering on the surface of the copper.

Heretofore, a combination of an acid and an oxidizing agent, e.g., an aqueous solution containing borofluoric acid and hydrogen peroxide, has been used as a stripping solution for solder. Such stripping solutions, however, are not suitable for use in the fabrication of a copper through-hole since the amount of copper dissolved by the action of such an acid is high. In accordance with the present invention, a copper inhibitor which prevents the dissolution of copper is added to the stripping solution; thus enables one to increase the acid concentration and solution temperature, whereby the rate of solder dissolution can be increased, and prevents the dissolution of copper.

As a result of research on copper inhibitors which prevent the dissolution of copper in the presence of an acid and an oxidizing agent and which also provide a copper surface with excellent solderability after the formation of the through-hole, it has been found that heterocyclic compounds free of sulfur atoms but containing a nitrogen atom in the form of $=NH$ or $\equiv N$ provide an excellent copper inhibition effect. The copper inhibitor of the invention is adsorbed onto the surface of the copper after solder stripping, forming a protective film thereon. Even at low pH conditions, therefore, the copper inhibitor of the present invention exhibits a satisfactory copper inhibition effect.

Based on the above discovery, various compounds were examined as copper inhibitors, and it has been found that the compounds as hereinafter described exhibit excellent effects as copper inhibitors.

1. Pyrrole and derivatives thereof
2. Pyrazole and derivatives thereof
3. Imidazole and derivatives thereof
4. Triazole and derivatives thereof It has been also found that thiazole, mercaptan, thiourea and derivatives thereof, which are outside the present invention, can also exhibit good effects as copper inhibitors, but provide inferior solderability effects after the formation of the copper through-hole. This is believed to be due to the fact that the sulfur ion present in the inhibitor molecule exerts an adverse influence on the copper surface with the passage of time.

Acids which can be used in the stripping solution of the present invention include inorganic acids such as hydrochloric acid, nitric acid, sulfuric acid, borofluoric acid, boric acid and chloric acid; organic acids such as oxalic acid, acetic acid, propionic acid, gluconic acid, tartaric acid, and formic acid; an ammonium salt, an alkali metal salt or an alkaline earth metal salt thereof; and a mixture thereof. Any acid capable of dissolving tin or tin alloys to form a solution (i.e., acid capable of easily reacting with tin or tin alloys to form a water-soluble salt and not forming water-soluble film on the surface of tin or tin alloys) can be used. After tin or tin alloys is dissolved by the acid to form a water-soluble salt solution, the resulting solution may form a precipitate.

Oxidizing agents which can be used include ferric chloride, potassium permanganate, peroxoborate, perchlorate and persulfate as well as hydrogen peroxide. Of these compounds, hydrogen peroxide is most preferred in that such is free of metals therein.

The copper inhibitor used herein is the heterocyclic compound containing =NH or ≡N as a ring-forming member which is free of a sulfur atom and which is soluble in acidic solution (preferred pH range of not higher than 2). The heterocyclic compound can be used singly or as a mixture thereof. The copper inhibitors used herein include pyrrole and derivatives thereof, pyrazole and derivatives thereof, imidazole and derivatives thereof, and triazole and derivatives thereof.

The pyrrole and derivatives thereof include pyrrole, pyrrolecarboxylic acid, indole, indolyl group-containing compounds (e.g., indolylacetic acid) and alkyl-substituted compounds thereof.

The pyrazole and derivatives thereof include pyrazole, pyrazole hydrochloride, pyrazolecarboxylic acid, indazole, N-alkyl-substituted indazole and indazolyl group-containing compounds.

The imidazole and derivatives thereof include imidazole, N-alkyl-substituted imidazole (e.g., N-methyl-substituted imidazole and N-ethyl-substituted imidazole) and imidazolyl group-containing compounds (e.g., urocanic acid).

The triazole and derivatives thereof include triazole, triazole hydrochloride, naphthotriazole, benzotriazole and halogen-substituted or alkyl-substituted compounds thereof.

Suitable examples of the copper inhibitor used herein include pyrrole, pyrazole, imidazole, triazole, and alkyl-substituted or halogen-substituted derivatives thereof.

The stripping solution of the present invention contains the inorganic and/or organic acid in a range of 50 g to 800 g per liter of the solution; the oxidizing agent in a range of 0.1 g to 400 g per liter of the solution; and the copper inhibitor (i.e., the heterocyclic compound containing =NH or ≡N as a ring-forming member and which is free of a sulfur atom) in a range of 0.1 g to 100 g per liter of the solution.

The stripping solution of the present invention may further contain other conventional components of stripping solution, for example, an accelerating agent, a tin ion stabilizer and a surface active agent.

Pressure, temperature and time for stripping using the solution of the present invention can be widely changed and are preferably in a range of 0.1 to 5 kg/m$^2$, 5° C. to 60° C. and 10 seconds to 10 minutes, respectively.

The following examples are given to illustrate the invention in greater detail.

In these examples, there was used, as a test sample, an epoxy-fiber glass laminate clad with copper on both sides (plated with copper to 20 microns on each side) and then clad with tin or solder (10 microns). The solder used is tin-lead solder having 60 wt% of tin and 40 wt% of lead. Adhesion of the solder resist was tested by crosscut test according to JIS D-0202-1966 after printing with SS INK SR-150G (produced by MEC Co., Ltd.; containing 95 wt% of epoxy resin (e.g., Epikote 828 produced by Shell International Chemicals Corp.)) as a solder resist followed by curing (dry thickness 20 microns). Solderability was tested using a Solder Checker SAT-2000 (produced by Reska Co., Ltd.). Unless otherwise indicated, all parts, percents, ratios, etc., are by weight.

EXAMPLE 1

Hydrochloric acid (35%): 100 g
Nitric acid (68%): 200 g
Hydrogen peroxide (35%): 50 g
Pyrrole: 50 g
Water to make: 1 liter When the tin plated test board was dipped in an aqueous solution having the formulation described above at 40° C., the tin was completely stripped in 3 minutes. The exposed copper surface had good luster and was not attacked at all. Even after it was dipped for an additional 30 minutes therein, the luster of the copper surface was not lost, i.e., no change was observed.

A uniform 25 micron thick copper foil bonded to a uniform 40 micron thick adhesive tape was dipped in the same aqueous solution as used above. After 1 hour, it was removed from the aqueous solution and the thickness was measured with a micrometer. The thicknesses before dipping and after dipping were 64 microns and 63.5 microns, respectively (in each case, the mean value of the values measured at 10 different spots). Thus, these was no appreciable difference between before and after the dipping.

EXAMPLE 2

Borofluoric acid (42%): 300 g
Hydrogen peroxide (35%): 100 g
Benzopyrazole: 10 g
Water to make: 1 liter When the solder-plated test board described above was placed in an aqueous solution having the formulation as described above and kept therein at 30° C. for 5 minutes the solder was completely stripped and the exposed copper surface had luster and was not attacked at all. Even after the copper was dipped for an additional 30 minutes there was observed no change in the luster of the copper surface.

In the same manner as in Example 1, the copper foil was dipped in the solution for 1 hour with the same results.

The test boards which were stripped of tin or solder in Examples 1 and 2 were tested for resist adhesion and solderability. For comparison, another board which was stripped of solder using a commercially available stripping solution [Enstrip TL-105 (produced by Japan Metal Co., Ltd., according to Japanese Patent Publication No. 17336/75) which contains sulfur-containing copper inhibitors, i.e., thiourea and metha-nitrobenzene sulfonate] was subjected to the same testings as described above. The results are shown in Table 1.

TABLE 1

|  | Example 1 | Example 2 | Comparative Example 1 |
|---|---|---|---|
| Resist Adhesion | A | A | B |

TABLE 1-continued

| | Example 1 | Example 2 | Comparative Example 1 |
|---|---|---|---|
| Solderability | A | A | C |

The symbols used above are defined as follows;
A ... Good
B ... Slightly bad
C ... Bad

COMPARATIVE EXAMPLE 2

Borofluoric acid (42%): 250 g
Glycolic acid (70%): 100 g
Benzothiazole: 5 g
Hydrogen peroxide (35%): 100 g
Water to make: 1 liter The solder-plated test board described above was dipped in an aqueous solution having the formulation as described above at a temperature of 30° C. for 5 minutes. At the end of this time the solder was completely dissolved. The exposed copper surface was lustrous and was not attacked at all. Even after it was dipped for additional 1 hour, there was no change in the luster of the copper surface. However, the substrate thus stripped of solder was dried and solderability was checked. As compared with Examples 1 and 2, it was inferior in solderability. This demonstrates that a sulfur-containing copper inhibitor (i.e., benzothiazole) is not suitable for use in the invention.

While the invention has been described in detail and with reference to specific embodiment thereof, it will be apparent to one skilled in the art that various changes and modifications can be made therein without departing from the spirit and scope thereof.

What is claimed is:

1. A stripping solution for tin and tin alloys comprising an inorganic and/or organic acid, an oxidizing agent and a heterocyclic compound free of sulfur but containing a nitrogen atom in the form of $=NH$ or $\equiv N$ as a ring-forming member.

2. The stripping solution as in claim 1, wherein the tin alloys are tin-lead alloy containing at least 10 wt % of tin and the balance of lead.

3. The stripping solution as in claim 1, wherein the inorganic acid is hydrochloric acid, nitric acid, sulfuric acid, borofluoric acid, boric acid or chloric acid.

4. The stripping solution as in claim 1, wherein the organic acid is oxalic acid, acetic acid, propionic acid, gluconic acid, tartaric acid or formic acid.

5. The stripping solution as in claim 1, wherein the oxidizing agent is ferric chloride, potassium permanganate peroxoborate, perchlorate, persulfate or hydrogen peroxide.

6. The stripping solution as in claim 1, wherein the heterocyclic compound is pyrrole and a derivative thereof, pyrazole and a derivative thereof, imidazole and a derivative thereof, or triazole and a derivative thereof.

7. The stripping solution as in claim 6, wherein the pyrrole and a derivative thereof are pyrrole, pyrrolecarboxylic acid, indole, or indolylacetic acid.

8. The stripping solution as in claim 6, wherein the pyrazole and a derivative thereof are pyrazole, pyrazole hydrochloride, pyrazolecarboxylic acid, or indazole.

9. The stripping solution as in claim 6, wherein the imidazole and a derivative thereof are imidazole, N-methyl-substituted imidazole, N-ethyl-substituted imidazole, or urocanic acid.

10. The stripping solution as in claim 6, wherein the triazole and a derivative thereof are triazole, triazole hydrochloride, naphthotriazole, or benzotriazole.

11. The stripping solution as in claim 1 or 6, wherein the heterocyclic compound is pyrrole, pyrazole, imidazole, or triazole.

12. The stripping solution as in claim 1, wherein the solution comprises an inorganic and/or organic acid in a range of 50 to 800 g per liter of the solution, an oxidizing agent in a range of 0.1 to 400 g per liter of the solution, and a heterocyclic compound free of sulfur atom but containing a nitrogen atom in the form of $=NH$ or $\equiv N$ as a ring-forming member in a range of 0.1 to 100 g per liter of the solution.

* * * * *